(12) United States Patent
Hu et al.

(10) Patent No.: US 11,477,906 B2
(45) Date of Patent: Oct. 18, 2022

(54) ASSEMBLY STRUCTURE AND CHASSIS

(71) Applicant: Wiwynn Corporation, New Taipei (TW)

(72) Inventors: Chao-Yen Hu, New Taipei (TW);
Yong-Yuan Yang, New Taipei (TW);
Wei-Li Huang, New Taipei (TW);
Chih-Hui Hsieh, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 118 days.

(21) Appl. No.: 17/152,712

(22) Filed: Jan. 19, 2021

(65) Prior Publication Data

US 2022/0159862 A1   May 19, 2022

(30) Foreign Application Priority Data

Nov. 19, 2020 (TW) .................. 109140524

(51) Int. Cl.
*H05K 7/00* (2006.01)
*H05K 7/14* (2006.01)
*F16B 5/02* (2006.01)

(52) U.S. Cl.
CPC ......... *H05K 7/1488* (2013.01); *F16B 5/0225* (2013.01)

(58) Field of Classification Search
CPC .. H05K 7/1488; H05K 5/0021; H05K 5/0221; F16B 5/0225; F16B 12/22; F16B 12/34; F16B 21/09; E05C 9/00; E05C 9/002; E05C 9/006; E05C 9/06; E05C 9/063; E05C 9/10; E05C 9/12; E05C 9/14; E05C 9/20; E05C 9/24; E05B 2063/0026; E05B 65/0057; E05B 65/006; E05B 65/0067; Y10T 292/08; Y10T 292/0801; Y10T 292/0834; Y10T 292/0836; Y10T 292/0837; Y10T 292/0838; Y10T 292/0839; Y10T 292/084; Y10T 292/0844;

(Continued)

(56) References Cited

U.S. PATENT DOCUMENTS 4,317,416 A * 3/1982 Baum ................. A47B 17/006
248/222.41
4,844,565 A * 7/1989 Brafford ................ H02B 1/308
312/111

(Continued)

FOREIGN PATENT DOCUMENTS

CN   114510125   *  5/2022
EP    3357373    *  8/2018

*Primary Examiner* — Janet M Wilkens
(74) *Attorney, Agent, or Firm* — Winston Hsu

(57) ABSTRACT

An assembly structure includes a first assembly member, a second assembly member, a first sliding member and a second sliding member. The first assembly member includes a first engaging portion and a second engaging portion. The first sliding member includes a first through hole and a first engaging recess. The first engaging portion is disposed in the first through hole. The second sliding member includes a second through hole and a second engaging recess. The second engaging portion is disposed in the second through hole. The first sliding member slides toward a first direction to drive the second sliding member to slide toward a second direction, such that the first engaging portion engages with the first engaging recess and the second engaging portion engages with the second engaging recess.

19 Claims, 11 Drawing Sheets

(58) Field of Classification Search
CPC ........... Y10T 292/0845; Y10T 292/696; Y10S 292/11
USPC ............ 312/223.1, 223.2, 265.5, 265.6, 111, 312/107.5, 195; 361/679.58
See application file for complete search history.

(56) References Cited

U.S. PATENT DOCUMENTS

| | | | | |
|---|---|---|---|---|
| 5,785,397 | A * | 7/1998 | Pavelski | H05K 5/0021 403/375 |
| 5,921,643 | A * | 7/1999 | Louth | A47B 47/02 312/111 |
| 6,722,167 | B1 * | 4/2004 | Hsu | E05B 65/462 70/79 |
| 6,762,932 | B2 * | 7/2004 | Regimbal | G06F 1/187 361/752 |
| 7,609,514 | B2 * | 10/2009 | Doczy | E05C 9/045 361/679.21 |
| 7,866,768 | B2 * | 1/2011 | Mallouk | A47B 87/0292 312/219 |
| 8,490,932 | B2 * | 7/2013 | Hsieh | G11B 33/124 248/220.21 |
| 2006/0133019 | A1 * | 6/2006 | Yamazaki | G06F 1/1616 361/679.21 |
| 2009/0134636 | A1 * | 5/2009 | Lee | E05C 9/045 292/174 |
| 2010/0232104 | A1 * | 9/2010 | Tang | E05B 65/006 361/679.58 |
| 2011/0156549 | A1 * | 6/2011 | Zhang | H05K 5/0221 292/13 |
| 2021/0134330 | A1 * | 5/2021 | Wu | G11B 33/124 |

\* cited by examiner

ASSEMBLY STRUCTURE AND CHASSIS

BACKGROUND OF THE INVENTION

1. Field of the Invention

The invention relates to an assembly structure and a chassis and, more particularly, to an assembly structure capable of being assembled or disassembled conveniently and a chassis equipped with the assembly structure.

2. Description of the Prior Art

At present, lots of devices are assembled by different assembly members (e.g. cover and base). Different assembly members are usually fixed to each other by a plurality of screws. When assembling or disassembling two assembly members, a user has to assemble or disassemble each of the screws one by one, such that the operation is inconvenient and time-consuming. Therefore, how to allow a user to assemble or disassemble two assembly members conveniently and rapidly has become a significant design issue.

SUMMARY OF THE INVENTION

The invention provides an assembly structure capable of being assembled or disassembled conveniently and a chassis equipped with the assembly structure, so as to solve the aforesaid problems.

According to an embodiment of the invention, an assembly structure comprises a first assembly member, a second assembly member, a first sliding member and a second sliding member. The first assembly member comprises a first engaging portion and a second engaging portion. The first sliding member is slidably disposed in the second assembly member. The first sliding member comprises a first through hole and a first engaging recess, wherein the first through hole communicates with the first engaging recess. The first engaging portion is disposed in the first through hole. The second sliding member is slidably disposed in the second assembly member. The second sliding member comprises a second through hole and a second engaging recess, wherein the second through hole communicates with the second engaging recess. The second engaging portion is disposed in the second through hole. The first sliding member slides toward a first direction to drive the second sliding member to slide toward a second direction, such that the first engaging portion engages with the first engaging recess and the second engaging portion engages with the second engaging recess, wherein the first direction is different from the second direction.

According to another embodiment of the invention, a chassis comprises a casing and an assembly structure. The assembly structure is disposed in the casing. The assembly structure comprises a first assembly member, a second assembly member, a first sliding member and a second sliding member. The first assembly member comprises a first engaging portion and a second engaging portion. The first sliding member is slidably disposed in the second assembly member. The first sliding member comprises a first through hole and a first engaging recess, wherein the first through hole communicates with the first engaging recess. The first engaging portion is disposed in the first through hole. The second sliding member is slidably disposed in the second assembly member. The second sliding member comprises a second through hole and a second engaging recess, wherein the second through hole communicates with the second engaging recess. The second engaging portion is disposed in the second through hole. The first sliding member slides toward a first direction to drive the second sliding member to slide toward a second direction, such that the first engaging portion engages with the first engaging recess and the second engaging portion engages with the second engaging recess, wherein the first direction is different from the second direction.

As mentioned in the above, when a user slides the first sliding member, the first sliding member and the second sliding member simultaneously engage with or disengage from the first engaging portion and the second engaging portion of the first assembly member in different directions. Accordingly, the user can assemble or disassemble the first assembly member and the second assembly member conveniently and rapidly by sliding the first sliding member.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
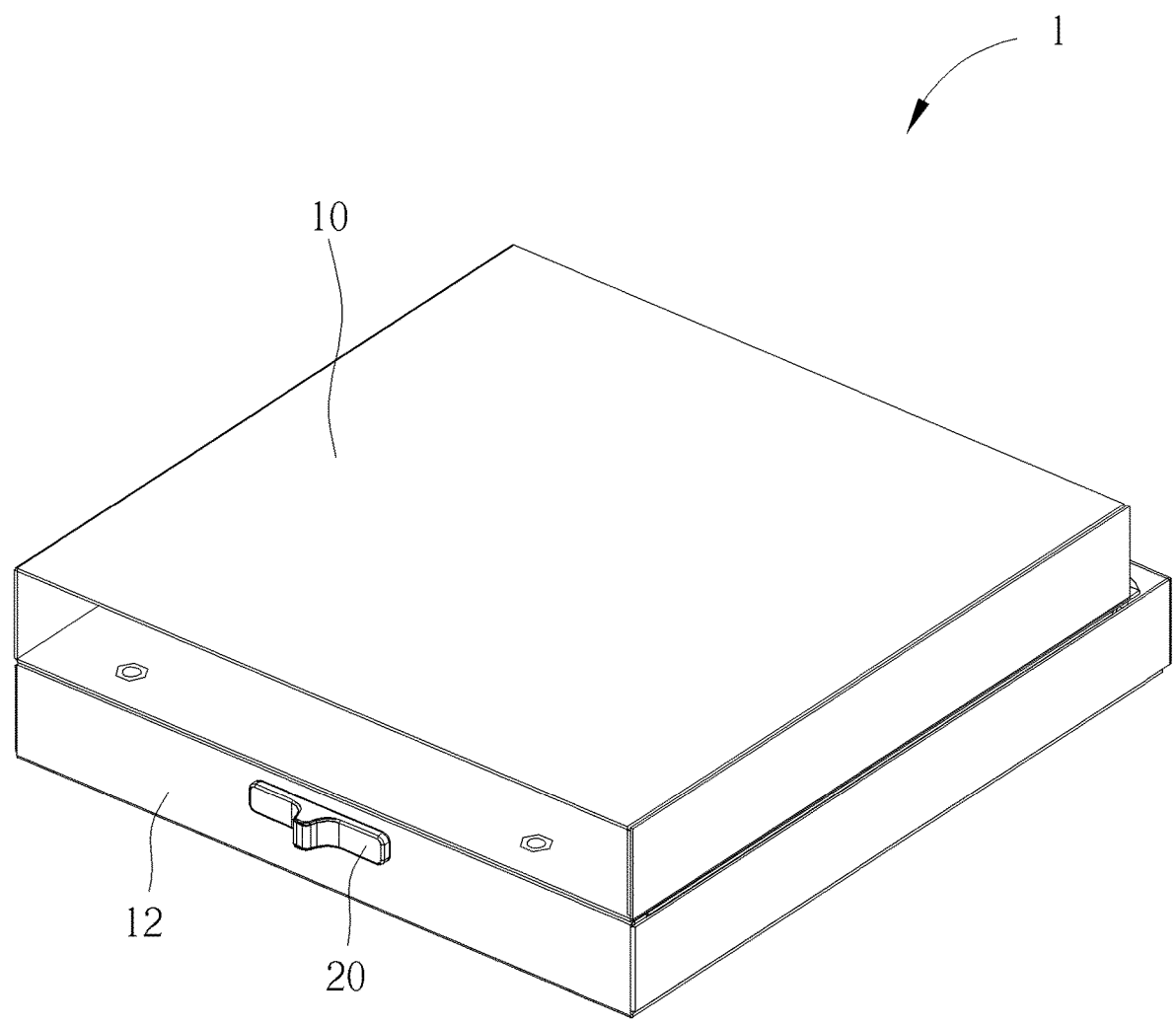
FIG. 1 is a perspective view illustrating an assembly structure according to an embodiment of the invention.
Figure 2:
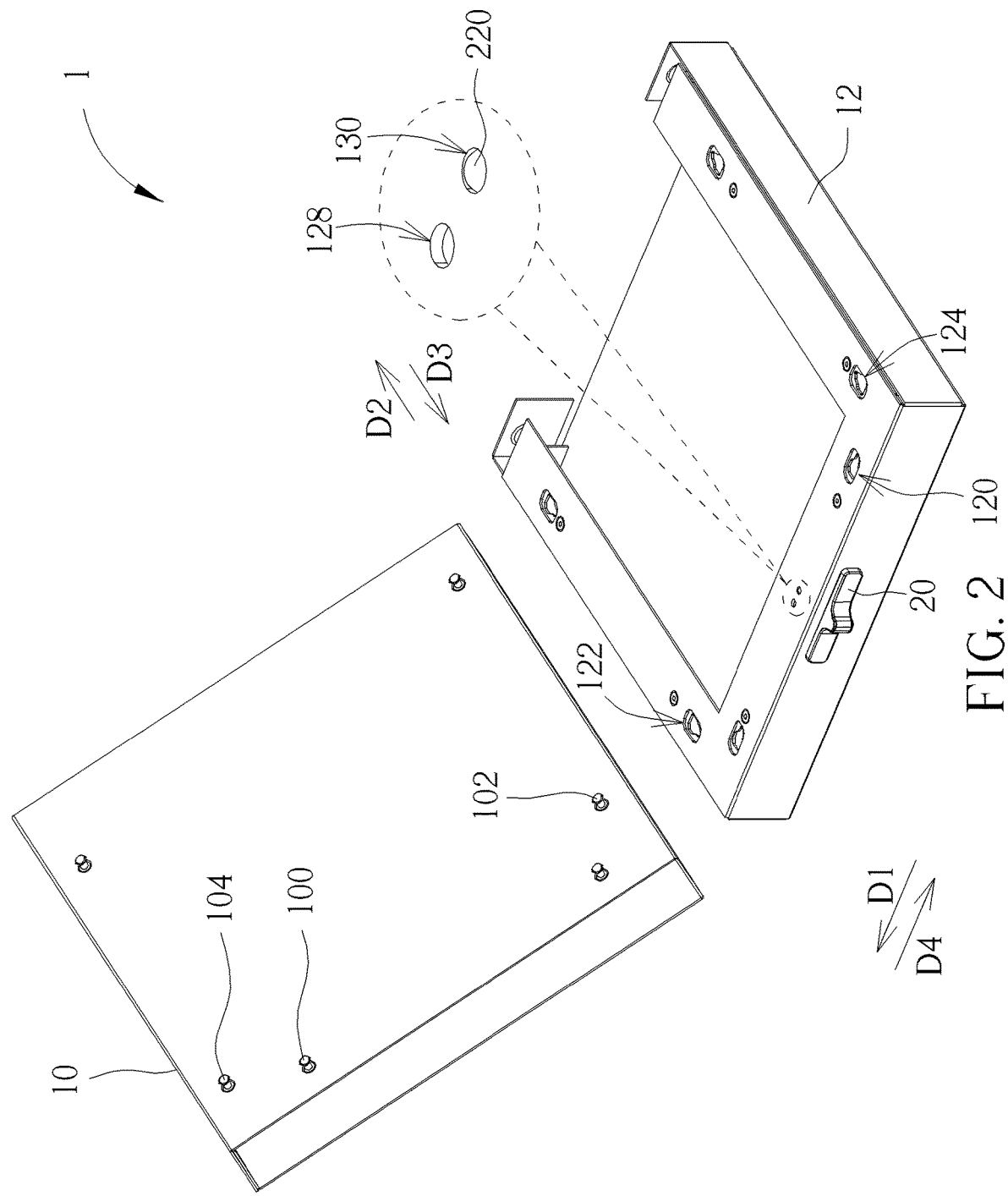
FIG. 2 is a partial exploded view illustrating the assembly structure shown in FIG. 1.
Figure 3:
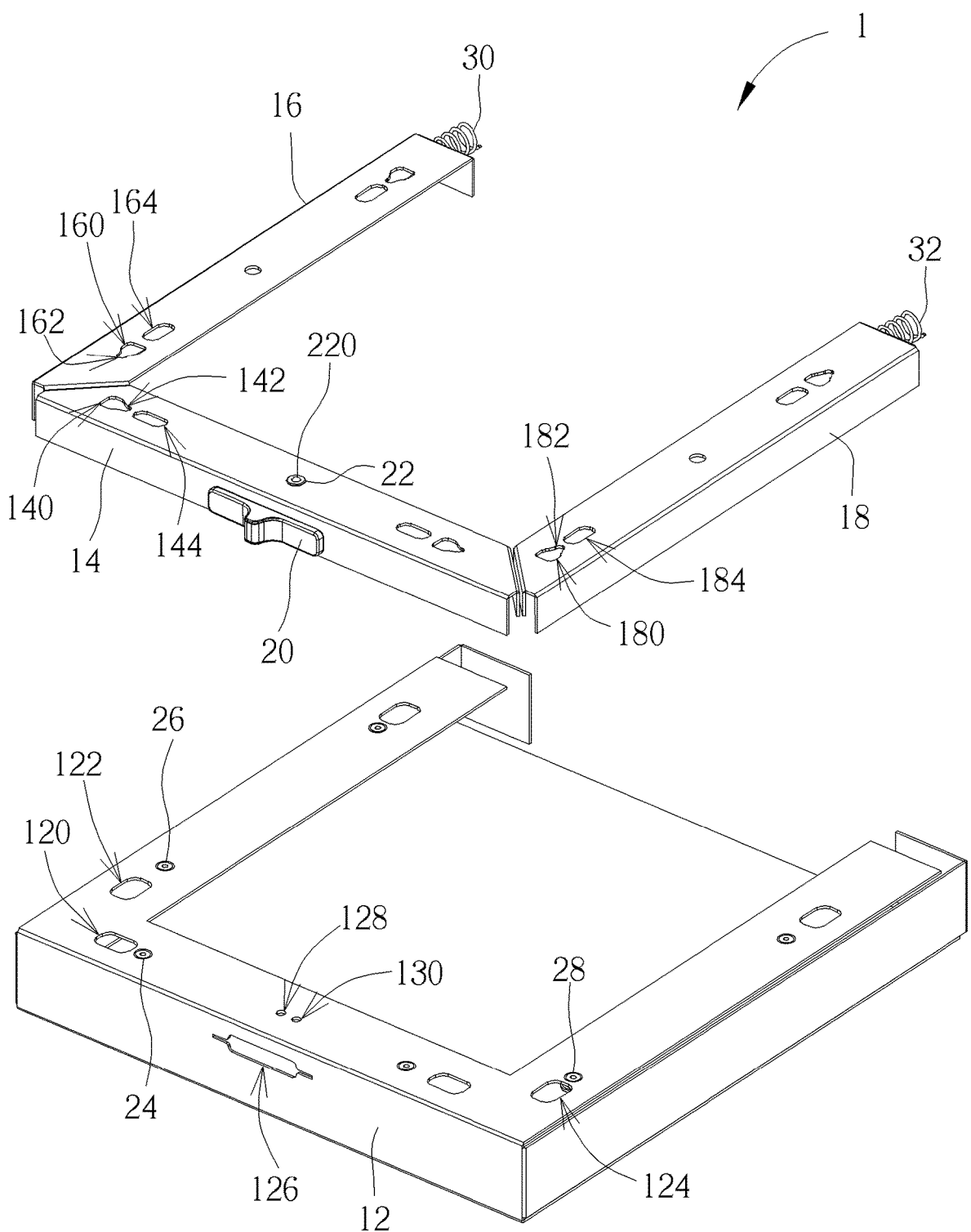
FIG. 3 is another partial exploded view illustrating the assembly structure shown in FIG. 1.
Figure 4:
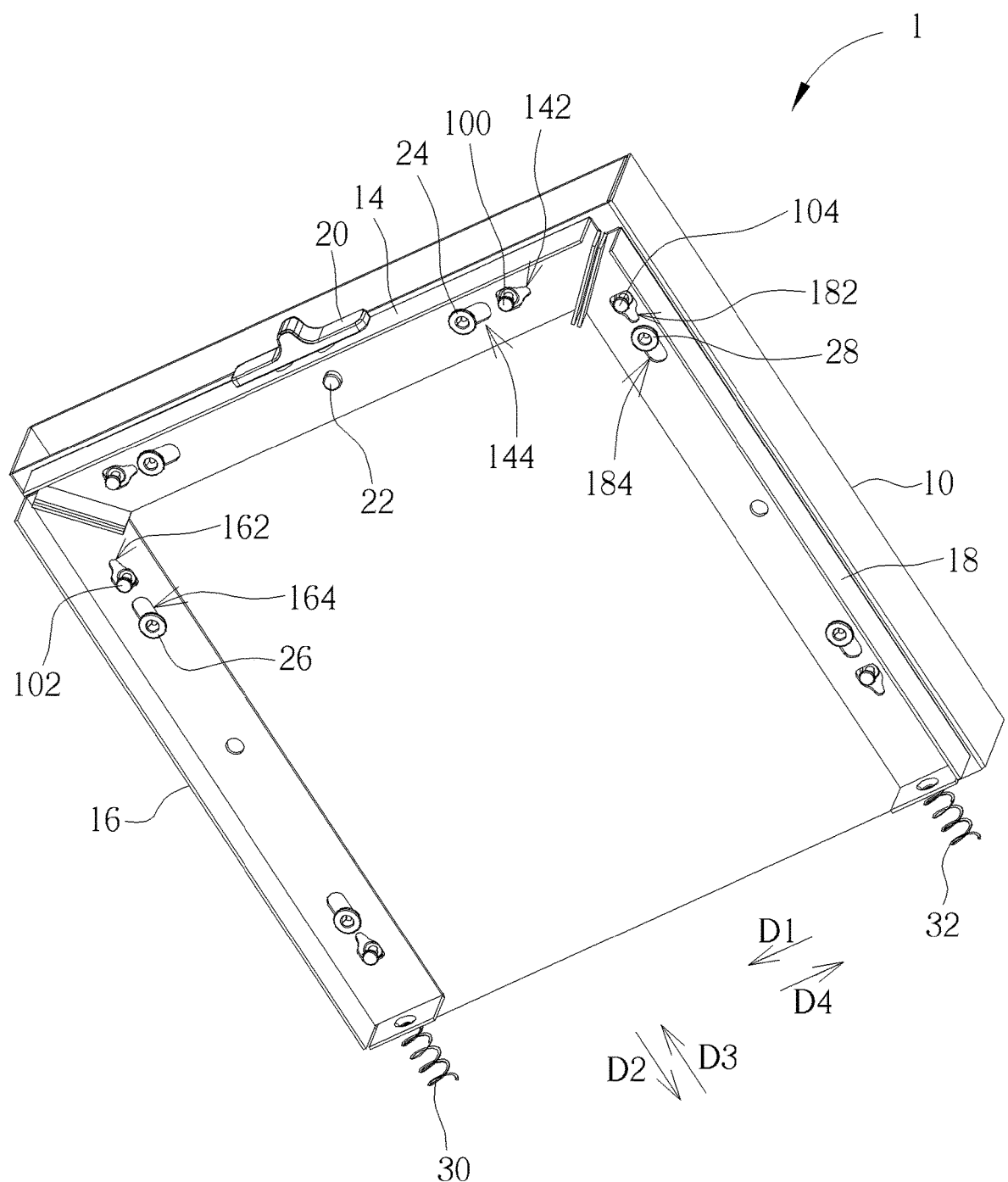
FIG. 4 is a perspective bottom view illustrating an operating member located at an unlock position.
Figure 5:
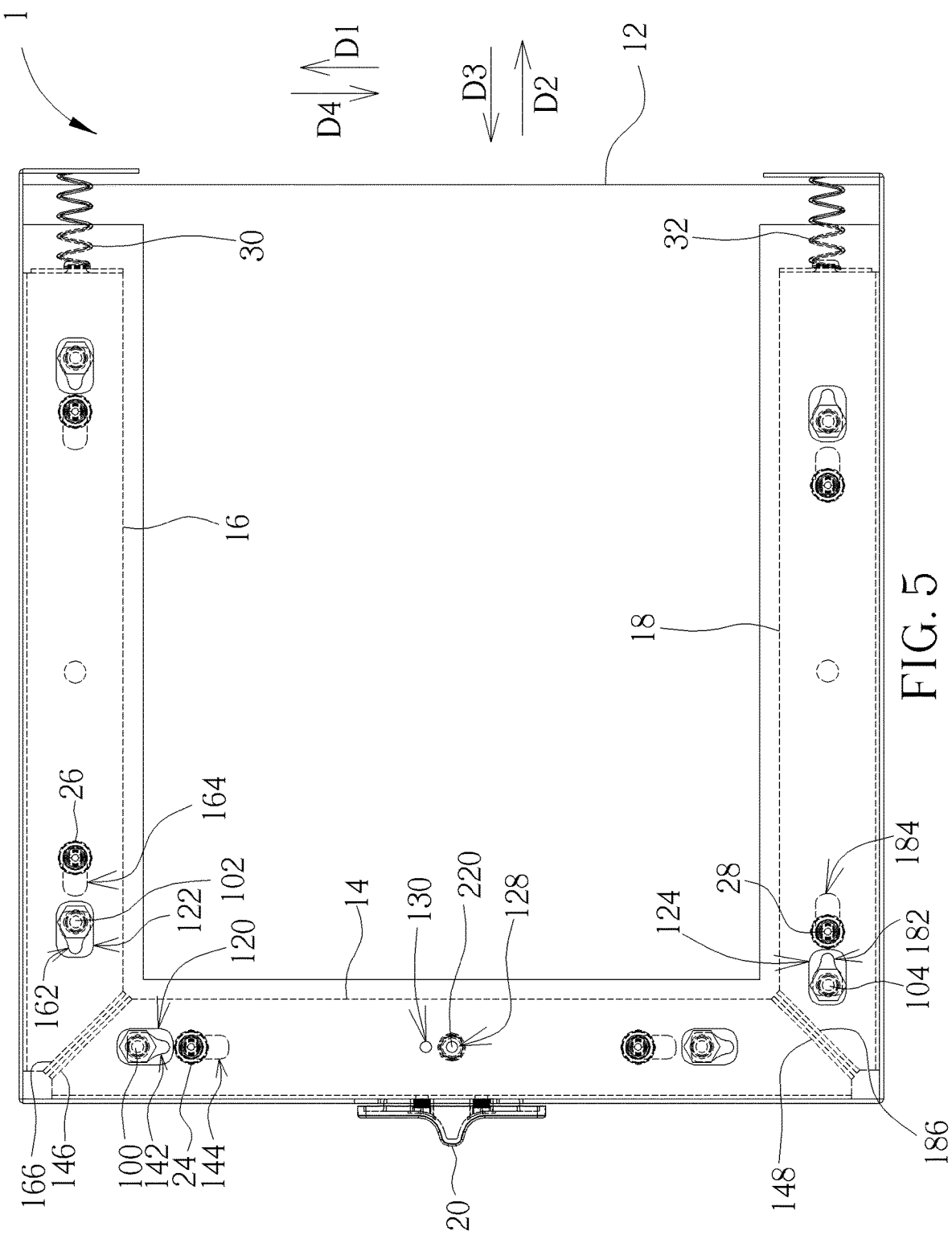
FIG. 5 is a top view illustrating an operating member located at an unlock position.
Figure 6:
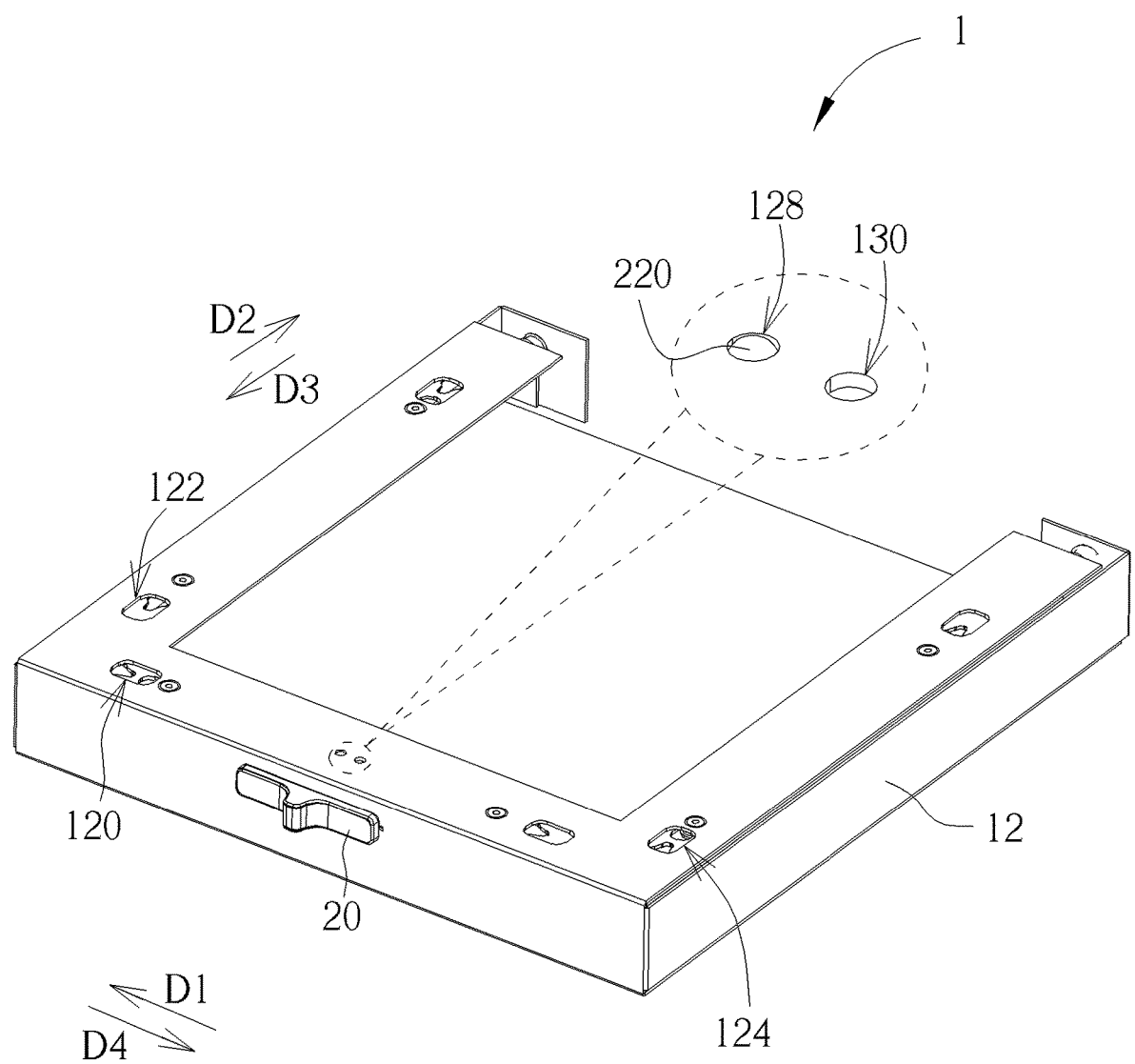
FIG. 6 is a perspective view illustrating an operating member located at a lock position.
Figure 7:
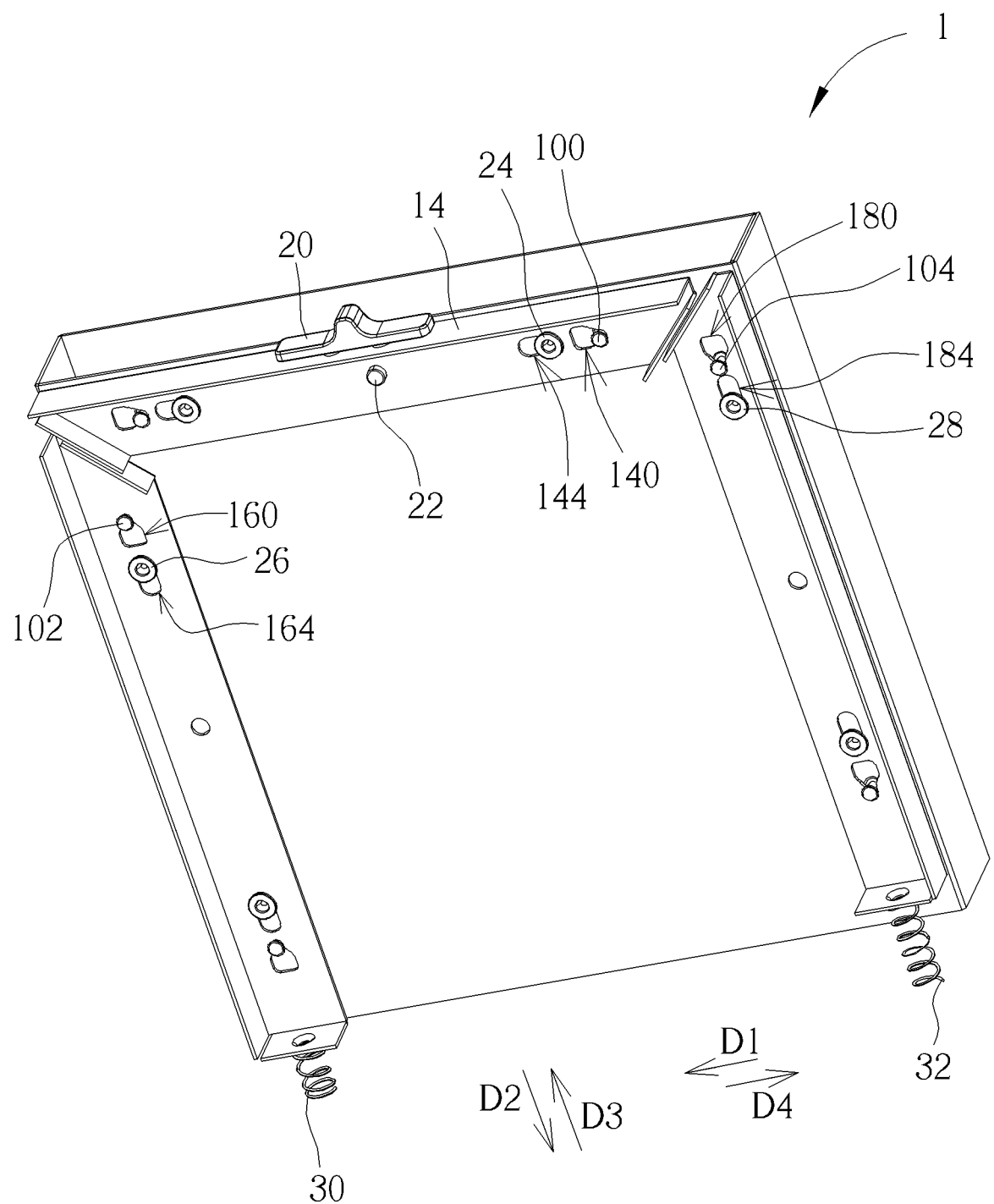
FIG. 7 is a perspective bottom view illustrating an operating member located at a lock position.
Figure 8:
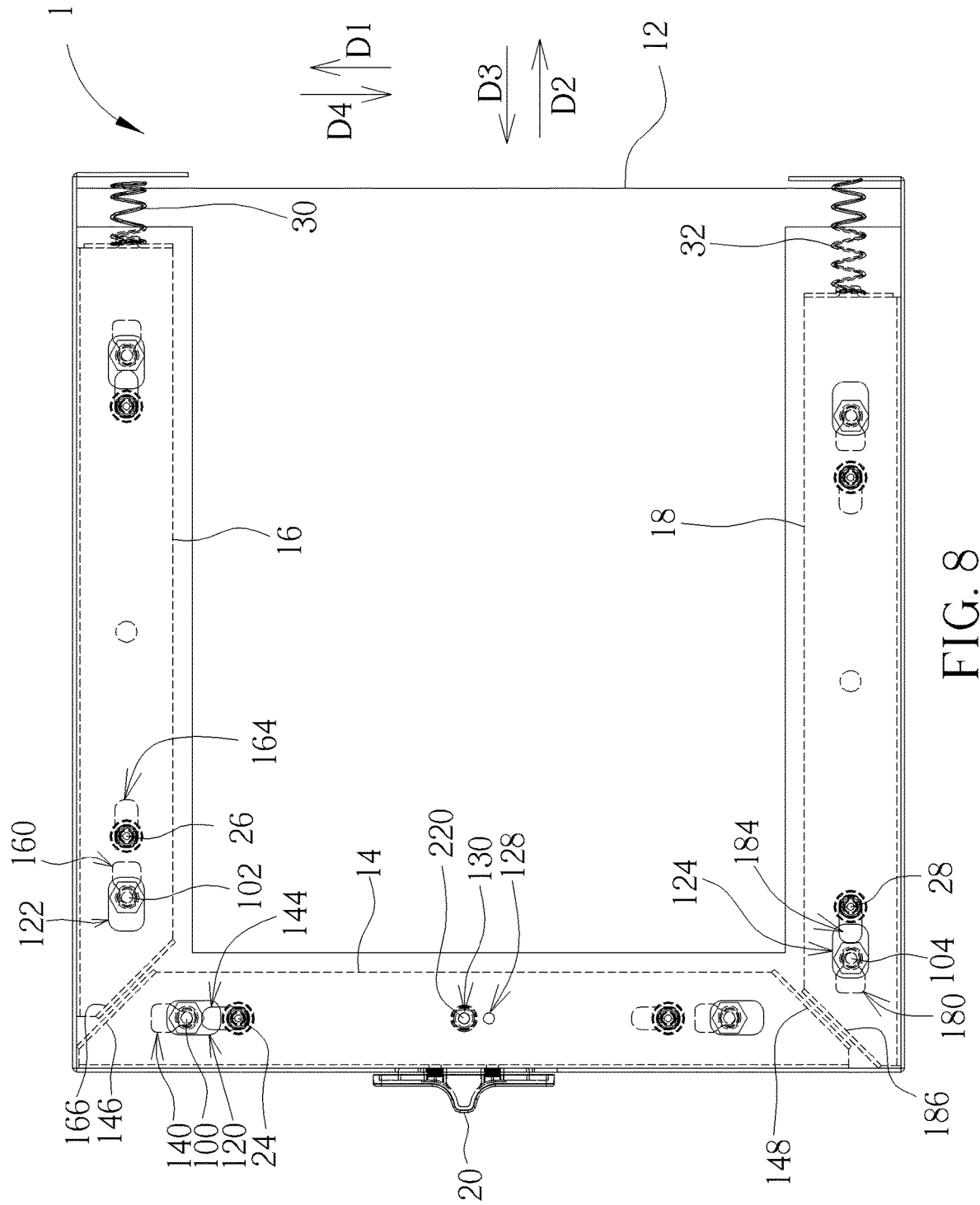
FIG. 8 is a top view illustrating an operating member located at a lock position.

Referring to FIGS. 1 to 8, FIG. 1 is a perspective view illustrating an assembly structure 1 according to an embodiment of the invention, FIG. 2 is a partial exploded view illustrating the assembly structure 1 shown in FIG. 1, FIG. 3 is another partial exploded view illustrating the assembly structure 1 shown in FIG. 1, FIG. 4 is a perspective bottom view illustrating an operating member 20 located at an unlock position, FIG. 5 is a top view illustrating an operating member 20 located at an unlock position, FIG. 6 is a perspective view illustrating an operating member 20 located at a lock position, FIG. 7 is a perspective bottom view illustrating an operating member 20 located at a lock position, and FIG. 8 is a top view illustrating an operating member 20 located at a lock position.

As shown in FIGS. 1 to 3, an assembly structure 1 comprises a first assembly member 10, a second assembly member 12, a first sliding member 14, a second sliding member 16, a third sliding member 18, an operating member 20, a positioning member 22, a first restraining member 24, a second restraining member 26, a third restraining member 28, a first elastic member 30 and a second elastic member 32. In this embodiment, the first assembly member 10 may be a cover of a server and the second assembly member 12 may be a base of the server, but the invention is not so limited. In practical applications, the first assembly member 10 and the second assembly member 12 may be any components capable of being assembled with each other and can be applied to various devices.

As shown in FIG. 2, the first assembly member 10 comprises a first engaging portion 100, a second engaging portion 102 and a third engaging portion 104. It should be noted that the number of the first engaging portions 100, the second engaging portions 102 and the third engaging portions 104 may be determined according to practical applications, so the invention is not limited to the embodiment shown in the figures. In this embodiment, the first engaging portion 100, the second engaging portion 102 and the third engaging portion 104 may be, but not limited to, I-shaped pins.

As shown in FIG. 2, the second assembly member 12 comprises a first opening 120, a second opening 122 and a third opening 124. It should be noted that the number of the first openings 120, the second openings 122 and the third openings 124 may be determined according to practical applications, so the invention is not limited to the embodiment shown in the figures. The number and position of the first openings 120, the second openings 122 and the third openings 124 correspond to the number and position of the first engaging portions 100, the second engaging portions 102 and the third engaging portions 104, respectively.

The first sliding member 14, the second sliding member 16 and the third sliding member 16 are slidably disposed in the second assembly member 12, wherein the second sliding member 16 and the third sliding member 18 are located at opposite sides of the first sliding member 14, as shown in FIG. 3. The first sliding member 14 comprises a first through hole 140 and a first engaging recess 142, wherein the first through hole 140 communicates with the first engaging recess 142. The second sliding member 16 comprises a second through hole 160 and a second engaging recess 162, wherein the second through hole 160 communicates with the second engaging recess 162. The third sliding member 18 comprises a third through hole 180 and a third engaging recess 182, wherein the third through hole 180 communicates with the third engaging recess 182. It should be noted that the number of the first through holes 140, the first engaging recesses 142, the second through holes 160, the second engaging recesses 162, the third through holes 180 and the third engaging recesses 182 may be determined according to practical applications, so the invention is not limited to the embodiment shown in the figures.

The number and position of the first through holes 140 and the first engaging recesses 142 of the first sliding member 14 correspond to the number and position of the first engaging portions 100 of the first assembly member 10, the number and position of the second through holes 160 and the second engaging recesses 162 of the second sliding member 16 correspond to the number and position of the second engaging portions 102 of the first assembly member 10, and the number and position of the third through holes 180 and the third engaging recesses 182 of the third sliding member 18 correspond to the number and position of the third engaging portions 104 of the first assembly member 10.

Furthermore, a width of a head of the first engaging portion 100 is larger than a width of the first engaging recess 142 and smaller than a width of the first through hole 140; a width of a head of the second engaging portion 102 is larger than a width of the second engaging recess 162 and smaller than a width of the second through hole 160; and a width of a head of the third engaging portion 104 is larger than a width of the third engaging recess 182 and smaller than a width of the third through hole 180.

As shown in FIG. 3, the second assembly member 12 further comprises a longitudinal groove 126. The operating member 20 is connected to the first sliding member 14 through the longitudinal groove 126. Accordingly, the operating member 20 can slide within the longitudinal groove 126 and drives the first sliding member 14 to slide with respect to the second assembly member 12. Furthermore, the positioning member 22 is disposed on the first sliding member 25, and the second assembly member 12 further comprises a first positioning hole 128 and a second positioning hole 130. A positioning portion 220 of the positioning member 22 may be embedded into one of the first positioning hole 128 and the second positioning hole 130, so as to position the first sliding member 14 on the second assembly member 12. In this embodiment, the positioning portion 220 may be, but not limited to, a ball plunger.

As shown in FIG. 5, the first elastic member 30 and the second elastic member 32 are disposed in the second assembly member 12. Opposite ends of the first elastic member 30 abut against the second sliding member 16 and a side wall of the second assembly member 12, respectively. Opposite ends of the second elastic member 32 abut against the third sliding member 18 and another side wall of the second assembly member 12, respectively. In this embodiment, the first elastic member 30 and the second elastic member 32 may be, but not limited to, springs.

As shown in FIGS. 3 and 4, the first restraining member 24, the second restraining member 26 and the third restraining member 28 are disposed on the second assembly member 12. In this embodiment, the first sliding member 14 further comprises a first restraining groove 144, the second sliding member 16 further comprises a second restraining groove 164, and the third sliding member 18 further comprises a third restraining groove 184. The first restraining member 24 is disposed in the first restraining groove 144 to restrain the first sliding member 14 on the second assembly member 12. The second restraining member 26 is disposed in the second restraining groove 164 to restrain the second sliding member 16 on the second assembly member 12. The third restraining member 28 is disposed in the third restraining groove 184 to restrain the third sliding member 18 on the second assembly member 12. In this embodiment, the first restraining member 24, the second restraining member 26 and the third restraining member 28 may be, but not limited to, rivets. It should be noted that the number of the first restraining member 24, the second restraining member 26, the third restraining member 28, the first restraining groove 144, the second restraining groove 164 and the third restraining groove 184 may be determined according to practical applications, so the invention is not limited to the embodiment shown in the figures. The number and position of the first restraining member 24, the second restraining member 26 and the third restraining member 28 correspond to the number and position of the first restraining groove 144, the second restraining groove 164 and the third restraining groove 184, respectively.

Before assembling the first assembly member 10 and the second assembly member 12, the operating member 20 is located at an unlock position shown in FIGS. 2, 4 and 5. At this time, the positioning portion 220 of the positioning member 22 is embedded into the second positioning hole 130 to position the first sliding member 14 at the unlock position on the second assembly member 12. Then, a user may dispose the first assembly member 10 on the second assembly member 12. At this time, the first engaging portion 100 is disposed in the first through hole 140 through the first opening 120, the second engaging portion 102 is disposed in the second through hole 160 through the second opening 122, and the third engaging portion 104 is disposed in the third through hole 180 through the third opening 124, such that the first assembly member 10 is disposed on the second assembly member 12.

Then, the user may slide the operating member 20 toward a first direction D1 to a lock position shown in FIGS. 6 to 8. At this time, the first sliding member 14 slides with the operating member 20 toward the first direction D1 to drive the second sliding member 16 to slide toward a second direction D2 and drive the third sliding member 18 to slide toward a third direction D3, such that the first engaging portion 100 engages with the first engaging recess 142, the second engaging portion 102 engages with the second engaging recess 162, and the third engaging portion 104 engages with the third engaging recess 182. The first direction D1 is different from the second direction D2 and the first direction D1 is also different from the third direction D3. In this embodiment, the first direction D1 is perpendicular to the second direction D2 and the third direction D3, and the second direction D2 is opposite to the third direction D3. In another embodiment, the first direction D1 may be not perpendicular to the second direction D2 and the third direction D3 according to practical applications. When the first engaging portion 100 engages with the first engaging recess 142, the positioning portion 220 of the positioning member 22 is embedded into the first positioning hole 128 to position the first sliding member 14 at the lock position on the second assembly member 12.

In this embodiment, the first sliding member 14 may further comprise a first inclined surface 146 and a third inclined surface 148, wherein the first inclined surface 146 and the third inclined surface 148 are located at opposite sides of the first sliding member 14, and an inclined direction of the first inclined surface 146 is opposite to an inclined direction of the third inclined surface 148. In this embodiment, an extension line of the first inclined surface 146 may be perpendicular to an extension line of the third inclined surface 148, but the invention is not so limited. Furthermore, the second sliding member 16 may further comprise a second inclined surface 166 and the third sliding member 18 may further comprise a fourth inclined surface 186. As shown in FIG. 5, when the first sliding member 14, the second sliding member 16 and the third sliding member 18 are disposed in the second assembly member 12, the second inclined surface 166 of the second sliding member 16 abuts against the first inclined surface 146 of the first sliding member 14, and the fourth inclined surface 186 of the third sliding member 18 abuts against the third inclined surface 148 of the first sliding member 14.

As shown in FIGS. 5 and 8, when the first sliding member 14 slides toward the first direction D1, the second inclined surface 166 slides with respect to the first inclined surface 146, so as to drive the second sliding member 16 to slide toward the second direction D2 and compress the first elastic member 30. Still further, the second elastic member 32 shown in FIG. 5 is situated at a compressed state. That is to say, the second elastic member 32 shown in FIG. 5 provides an elastic force to push the third sliding member 18 toward the third direction D3. Accordingly, when the first sliding member 14 slides toward the first direction D1, the fourth inclined surface 186 slides with respect to the third inclined surface 148 due to the elastic force provided by the second elastic member 32, so as to drive the third sliding member 18 to slide toward the third direction D3.

When the user wants to detach the first assembly member 10 from the second assembly member 12, the user may slide the operating member 40 toward a fourth direction D4 to the unlock position shown in FIGS. 2, 4 and 5. At this time, the first sliding member 14 slides with the operating member 20 toward the fourth direction D4 to drive the second sliding member 16 to slide toward the third direction D3 and drive the third sliding member 18 to slide toward the second direction D2, such that the first engaging portion 100 disengages from the first engaging recess 142, the second engaging portion 102 disengages from the second engaging recess 162, and the third engaging portion 104 disengages from the third engaging recess 182. When the first engaging portion 100 disengages from the first engaging recess 142, the positioning portion 220 of the positioning member 22 is embedded into the second positioning hole 130 to position the first sliding member 14 at the unlock position on the second assembly member 12. Then, the user may detach the first assembly member 10 from the second assembly member 12.

Figure 9:
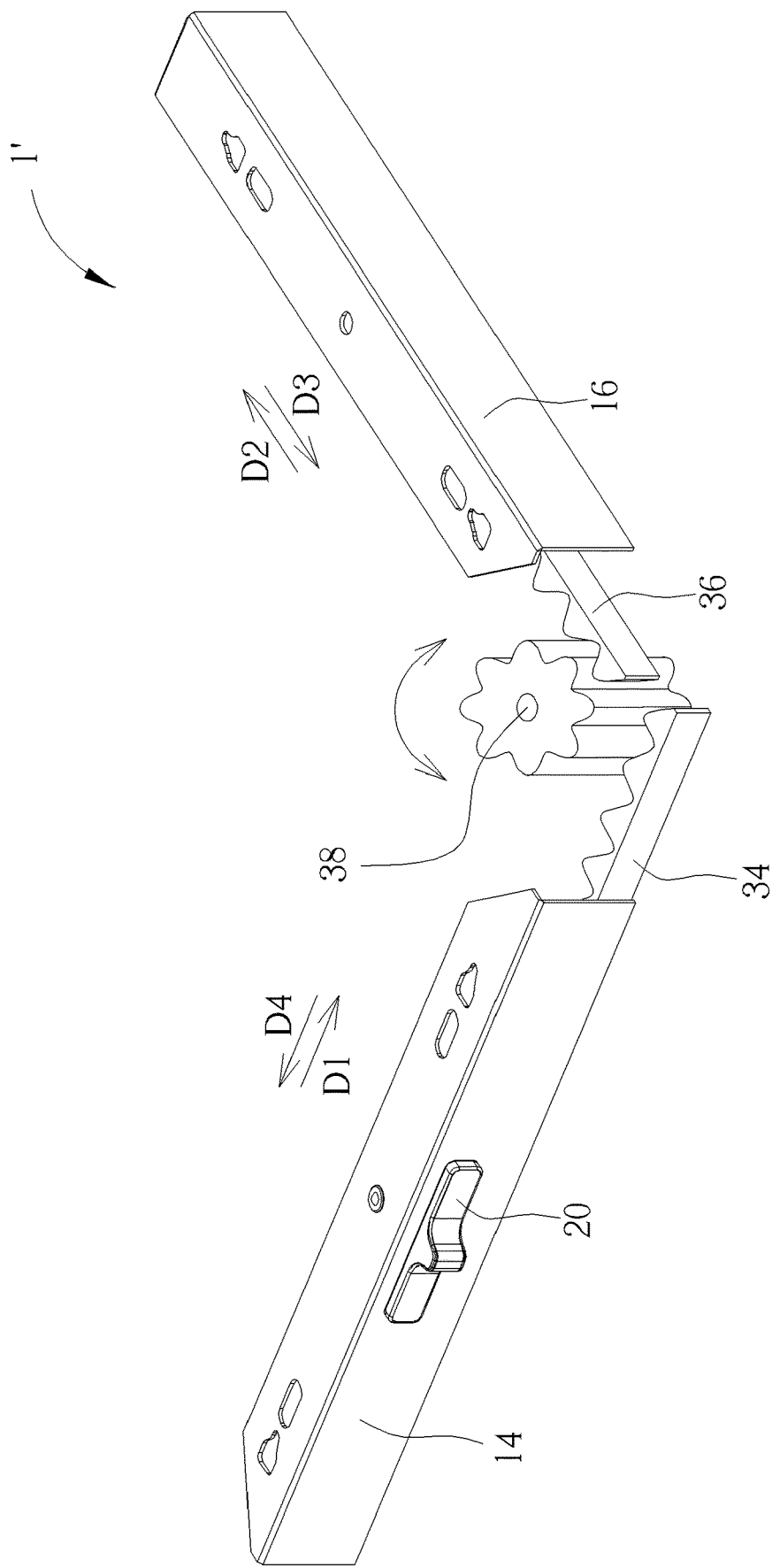
FIG. 9 is a partial perspective view illustrating an assembly structure according to another embodiment of the invention.

As shown in FIG. 9, FIG. 9 is a partial perspective view illustrating an assembly structure 1' according to another embodiment of the invention. The main difference between the assembly structure 1' and the aforesaid assembly structure 1 is that the assembly structure 1' further comprises a first rack 34, a second rack 36 and a gear 38. As shown in FIG. 9, the first rack 34 is connected to the first sliding member 14 and the second rack 36 is connected to the second sliding member 36. Furthermore, the first rack 34 and the second rack 36 mesh with the gear 38. When the first sliding member 14 slides toward the first direction D1 or the fourth direction D4, the first rack 34 drives the gear 38 to rotate and the gear 38 drives the second rack 36 to slide, so as to drive the second sliding member 16 to slide toward the second direction D2 or the third direction D3. In other words, the invention may replace the inclined surface and the elastic member mentioned in the above by the rack and the gear, such that the first sliding member 14 can drive the second sliding member 16 to slide. Similarly, the invention may also replace the inclined surface and the elastic member mentioned in the above by the rack and the gear, such that the first sliding member 14 can drive the third sliding member 18 to slide.

Figure 10:
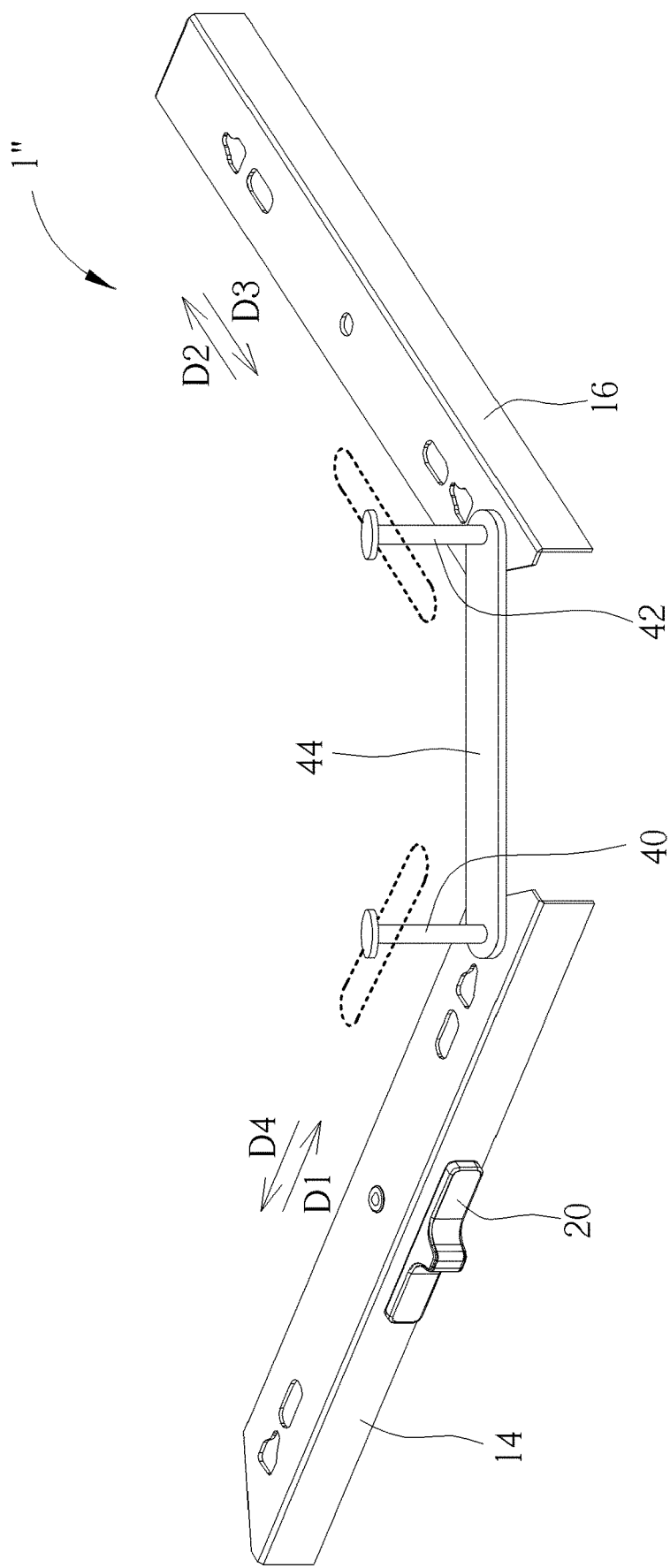
FIG. 10 is a partial perspective view illustrating an assembly structure according to another embodiment of the invention.

Referring to FIG. 10, FIG. 10 is a partial perspective view illustrating an assembly structure 1" according to another embodiment of the invention. The main difference between the assembly structure 1" and the aforesaid assembly structure 1 is that the assembly structure 1" further comprises a first rod member 40, a second rod member 42 and a linking member 44, as shown in FIG. 10. The first rod member 40 is connected to the first sliding member 14 and the second rod member 42 is connected to the second sliding member 16. Furthermore, the linking member 44 is rotatably connected to the first rod member 40 and the second rod member 42. When the first sliding member 14 slides toward the first direction D1 or the fourth direction D4, the first rod member 40 drives the second rod member 42 to slide through the linking member 44, so as to drive the second sliding member 16 to slide toward the second direction D2 or the third direction D3. In other words, the invention may replace the inclined surface and the elastic member mentioned in the above by the rod member and the linking member, such that the first sliding member 14 can drive the second sliding member 16 to slide. Similarly, the invention may also replace the inclined surface and the elastic member mentioned in the above by the rod member and the linking member, such that the first sliding member 14 can drive the third sliding member 18 to slide.

Figure 11:
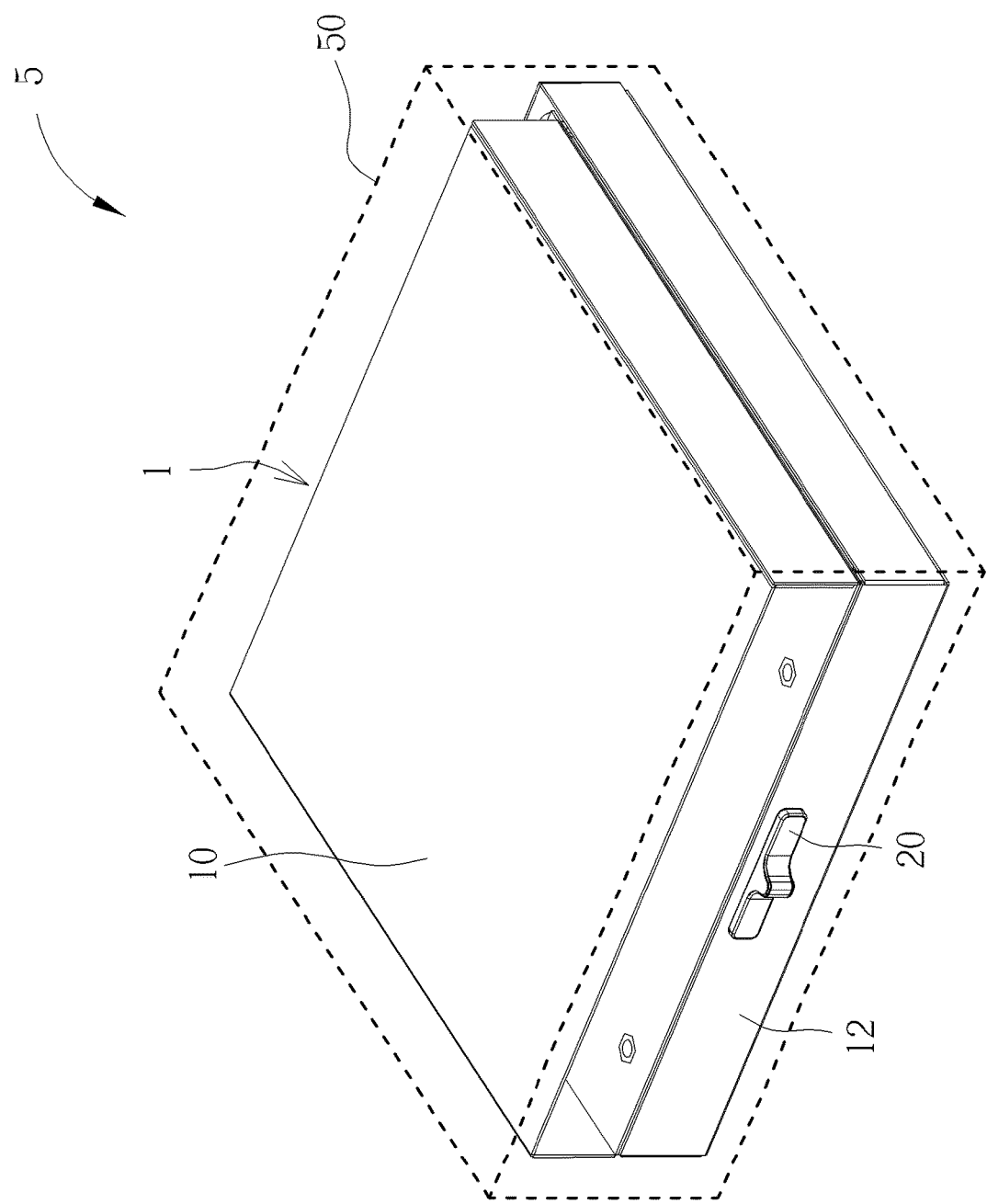
FIG. 11 is a schematic view illustrating a chassis according to another embodiment of the invention.

Referring to FIG. 11, FIG. 11 is a schematic view illustrating a chassis 5 according to another embodiment of the invention. As shown in FIG. 11, a chassis 5 comprises a casing 50 and the aforesaid assembly structure 1. It should be noted that the assembly structure 1 may also be replaced by the aforesaid assembly structure 1' or 1". In this embodiment, the chassis 5 may be, but not limited to, a chassis of a server. It should be noted that the casing 50 shown in FIG. 11 is only for illustration purpose and the casing 50 is illustrated by dotted line. The assembly structure 1 of the invention may be disposed in the casing 50 to form the chassis 5, so as to be applied to various devices (e.g. server).

As mentioned in the above, when a user slides the first sliding member, the first sliding member, the second sliding member and the third sliding member simultaneously engage with or disengage from the first engaging portion, the second engaging portion and the third engaging portion of the first assembly member in different directions. Accordingly, the user can assemble or disassemble the first assembly member and the second assembly member conveniently and rapidly by sliding the first sliding member. It should be noted that when only two adjacent sides between the first assembly member and the second assembly member need to be fixed, the invention may omit the third sliding member.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An assembly structure comprising:
  a first assembly member comprising a first engaging portion and a second engaging portion;
  a second assembly member comprising a first positioning hole and a second positioning hole;
  a first sliding member slidably disposed in the second assembly member, the first sliding member comprising a first through hole and a first engaging recess, the first through hole communicating with the first engaging recess, the first engaging portion being disposed in the first through hole;
  a second sliding member slidably disposed in the second assembly member, the second sliding member comprising a second through hole and a second engaging recess, the second through hole communicating with the second engaging recess, the second engaging portion being disposed in the second through hole; and
  a positioning member disposed on the first sliding member;
  wherein the first sliding member slides toward a first direction to drive the second sliding member to slide toward a second direction, such that the first engaging portion engages with the first engaging recess and the second engaging portion engages with the second engaging recess; the first direction is different from the second direction;
  wherein, when the first engaging portion engages with the first engaging recess, a positioning portion of the positioning member is embedded into the first positioning hole; when the first engaging portion disengages from the first engaging recess, the positioning portion of the positioning member is embedded into the second positioning hole.

2. The assembly structure of claim 1, further comprising an operating member, the second assembly member further comprising a longitudinal groove, the operating member is connected to the first sliding member through the longitudinal groove.

3. The assembly structure of claim 1, further comprising a first restraining member and a second restraining member disposed on the second assembly member, the first sliding member further comprising a first restraining groove, the second sliding member further comprising a second restraining groove, the first restraining member being disposed in the first restraining groove, the second restraining member being disposed in the second restraining groove.

4. The assembly structure of claim 1, wherein the first sliding member further comprises a first inclined surface, the second sliding member further comprises a second inclined surface, and the second inclined surface abuts against the first inclined surface; when the first sliding member slides toward the first direction, the second inclined surface slides with respect to the first inclined surface, so as to drive the second sliding member to slide toward the second direction.

5. The assembly structure of claim 1, further comprising a third sliding member slidably disposed in the second assembly member, the second sliding member and the third sliding member being located at opposite sides of the first sliding member, the third sliding member comprising a third through hole and a third engaging recess, the third through hole communicating with the third engaging recess, the first assembly member further comprising a third engaging portion, the third engaging portion being disposed in the third through hole; the first sliding member sliding toward the first direction to drive the third sliding member to slide toward a third direction, such that the third engaging portion engages with the third engaging recess; the first direction being different from the third direction and the second direction being opposite to the third direction.

6. The assembly structure of claim 5, further comprising a third restraining member disposed on the second assembly member, the third sliding member further comprising a third restraining groove, the third restraining member being disposed in the third restraining groove.

7. The assembly structure of claim 5, wherein the first sliding member further comprises a third inclined surface, the third sliding member further comprises a fourth inclined surface, and the fourth inclined surface abuts against the third inclined surface; when the first sliding member slides toward the first direction, the fourth inclined surface slides with respect to the third inclined surface, so as to drive the third sliding member to slide toward the third direction.

8. The assembly structure of claim 5, further comprising a first elastic member and a second elastic member, the first elastic member and the second elastic member being disposed in the second assembly member, opposite ends of the first elastic member abutting against the second sliding member and the second assembly member, opposite ends of the second elastic member abutting against the third sliding member and the second assembly member.

9. The assembly structure of claim 1, further comprising a first rack, a second rack and a gear, the first rack being connected to the first sliding member, the second rack being connected to the second sliding member, the first rack and the second rack meshing with the gear; when the first sliding member slides toward the first direction, the first rack driving the gear to rotate and the gear driving the second rack to slide, so as to drive the second sliding member to slide toward the second direction.

10. The assembly structure of claim 1, further comprising a first rod member, a second rod member and a linking member, the first rod member being connected to the first sliding member, the second rod member being connected to the second sliding member, the linking member being rotatably connected to the first rod member and the second rod member; when the first sliding member slides toward the first direction, the first rod member driving the second rod member to slide through the linking member, so as to drive the second sliding member to slide toward the second direction.

11. The assembly structure of claim 1, wherein the first direction is perpendicular to the second direction.

12. The assembly structure of claim 1, wherein the second assembly member comprises a first opening and a second opening, the first engaging portion is disposed in the first through hole through the first opening, and the second engaging portion is disposed in the second through hole through the second opening.

13. The assembly structure of claim 1, wherein the first sliding member further comprises a first inclined surface and a third inclined surface, the first inclined surface and the third inclined surface are located at opposite sides of the first sliding member, and an extension line of the first inclined surface is perpendicular to an extension line of the third inclined surface.

14. A chassis comprising:
a casing; and
an assembly structure disposed in the casing, the assembly structure comprising:
  a first assembly member comprising a first engaging portion and a second engaging portion;
  a second assembly member comprising a first positioning hole and a second positioning hole;
  a first sliding member slidably disposed in the second assembly member, the first sliding member comprising a first through hole and a first engaging recess, the first through hole communicating with the first engaging recess, the first engaging portion being disposed in the first through hole;
  a second sliding member slidably disposed in the second assembly member, the second sliding member comprising a second through hole and a second engaging recess, the second through hole communicating with the second engaging recess, the second engaging portion being disposed in the second through hole; and
  a positioning member disposed on the first sliding member;
  wherein the first sliding member slides toward a first direction to drive the second sliding member to slide toward a second direction, such that the first engaging portion engages with the first engaging recess and the second engaging portion engages with the second engaging recess; the first direction is different from the second direction;

wherein, when the first engaging portion engages with the first engaging recess, a positioning portion of the positioning member is embedded into the first positioning hole; when the first engaging portion disengages from the first engaging recess, the positioning portion of the positioning member is embedded into the second positioning hole.

15. The chassis of claim 14, wherein the first sliding member further comprises a first inclined surface, the second sliding member further comprises a second inclined surface, and the second inclined surface abuts against the first inclined surface; when the first sliding member slides toward the first direction, the second inclined surface slides with respect to the first inclined surface, so as to drive the second sliding member to slide toward the second direction.

16. The chassis of claim 14, wherein the assembly structure further comprises a third sliding member slidably disposed in the second assembly member, the second sliding member and the third sliding member are located at opposite sides of the first sliding member, the third sliding member comprises a third through hole and a third engaging recess, the third through hole communicates with the third engaging recess, the first assembly member further comprises a third engaging portion, the third engaging portion is disposed in the third through hole; the first sliding member slides toward the first direction to drive the third sliding member to slide toward a third direction, such that the third engaging portion engages with the third engaging recess; the first direction is different from the third direction and the second direction is opposite to the third direction.

17. The chassis of claim 14, wherein the assembly structure further comprises a first rack, a second rack and a gear, the first rack is connected to the first sliding member, the second rack is connected to the second sliding member, the first rack and the second rack mesh with the gear; when the first sliding member slides toward the first direction, the first rack drives the gear to rotate and the gear drives the second rack to slide, so as to drive the second sliding member to slide toward the second direction.

18. The chassis of claim 14, wherein the assembly structure further comprises a first rod member, a second rod member and a linking member, the first rod member is connected to the first sliding member, the second rod member is connected to the second sliding member, the linking member is rotatably connected to the first rod member and the second rod member; when the first sliding member slides toward the first direction, the first rod member drives the second rod member to slide through the linking member, so as to drive the second sliding member to slide toward the second direction.

19. The chassis of claim 14, wherein the first sliding member further comprises a first inclined surface and a third inclined surface, the first inclined surface and the third inclined surface are located at opposite sides of the first sliding member, and an extension line of the first inclined surface is perpendicular to an extension line of the third inclined surface.

* * * * *